(12) United States Patent
Hajaj et al.

(10) Patent No.: US 11,726,410 B2
(45) Date of Patent: Aug. 15, 2023

(54) MULTI-RESOLUTION OVERLAY METROLOGY TARGETS

(71) Applicant: KLA Corporation, Milpitas, CA (US)

(72) Inventors: Eitan Hajaj, Ashqelon (IL); Amnon Manassen, Haifa (IL); Shlomo Eisenbach, Migdal HaEmek (IL); Anna Golotsvan, Qiryat Tivon (IL); Yoav Grauer, Milpitas, CA (US); Eugene Maslovsky, Haifa (IL)

(73) Assignee: KLA Corporation, Milpitas, CA (US)

( * ) Notice: Subject to any disclaimer, the term of this patent is extended or adjusted under 35 U.S.C. 154(b) by 1 day.

(21) Appl. No.: 17/351,137

(22) Filed: Jun. 17, 2021

(65) Prior Publication Data

US 2022/0334501 A1 Oct. 20, 2022

Related U.S. Application Data

(60) Provisional application No. 63/176,888, filed on Apr. 20, 2021.

(51) Int. Cl.
*G03F 7/20* (2006.01)
*G03F 7/00* (2006.01)
*H01L 21/66* (2006.01)

(52) U.S. Cl.
CPC ...... *G03F 7/70633* (2013.01); *G03F 7/70683* (2013.01); *H01L 22/12* (2013.01)

(58) Field of Classification Search
CPC ............. G03F 7/70633; G03F 7/70683; G03F 7/70625; H01L 22/12
See application file for complete search history.

(56) References Cited

U.S. PATENT DOCUMENTS

| | | | |
|---|---|---|---|
| 7,440,105 B2 | 10/2008 | Adel et al. | |
| 10,527,951 B2 | 1/2020 | Yohanan et al. | |
| 2003/0156276 A1 | 8/2003 | Bowes | |
| 2004/0066517 A1 | 4/2004 | Huang et al. | |
| 2013/0148120 A1* | 6/2013 | Okamoto | G03F 7/70633 356/401 |
| 2016/0071255 A1 | 3/2016 | Lee et al. | |
| 2016/0179017 A1* | 6/2016 | Yohanan | G03F 7/70625 359/566 |

FOREIGN PATENT DOCUMENTS

KR 100612410 B1 8/2006

OTHER PUBLICATIONS

WIPO, International Search Report for International Application No. PCT/US2021/045292, dated Jan. 19, 2022.

* cited by examiner

*Primary Examiner* — Peter B Kim
(74) *Attorney, Agent, or Firm* — Hodgson Russ LLP

(57) ABSTRACT

A product includes at least one semiconductor substrate, multiple thin-film layers disposed on the at least one substrate, and an overlay target formed in at least one of the thin-film layers. The overlay target includes a first sub-target having a first center of symmetry and including first target features having a first linewidth, and a second sub-target having a second center of symmetry coincident with the first center of symmetry and including second target features, which have a second linewidth, greater than the first linewidth, and are adjacent to but non-overlapping with the first target features.

22 Claims, 9 Drawing Sheets

MULTI-RESOLUTION OVERLAY METROLOGY TARGETS

CROSS-REFERENCE TO RELATED APPLICATION

This application claims the benefit of U.S. Provisional Patent Application 63/176,888, filed Apr. 20, 2021.

FIELD OF THE INVENTION

The present invention relates generally to manufacture of semiconductor devices, and particularly to methods and target features for semiconductor circuit metrology.

BACKGROUND

Semiconductor circuits are commonly manufactured using photolithographic methods. In photolithography, a thin layer of a photosensitive polymer (photoresist) is deposited over a semiconductor substrate and patterned using optical or other radiation, leaving parts of the substrate covered by the photoresist. After patterning, the substrate is modified by methods such as etching and ion bombardment to change the material properties or the topography of the substrate, while the parts of the substrate covered by the photoresist are not affected.

Semiconductor circuit metrology is used for measuring properties of the patterned photoresist, such as the topography and location of the patterned features. Accurate location of the patterned features of the photoresist with respect to previous process layers is crucial for assuring a high yield of the photolithographic process. Any error in the registration (misregistration) of the patterned photoresist with respect to an underlying process layer is referred to as "overlay error." As an example, in typical semiconductor circuits with minimum line-widths of 10-14 nm (so-called 10-nm design rule), the maximal permissible overlay error is 2-3 nm. In leading-edge semiconductor circuits, the line-widths are shrinking to 5 nm, with a concomitant reduction in maximal permissible overlay error.

Overlay error is commonly measured using optical overlay metrology tools, as optical radiation in the visible and infrared wavelengths is capable of penetrating through the photoresist layer, as well as through dielectric layers under the photoresist. Furthermore, infrared wavelengths are capable of penetrating a semiconductor substrate, such as silicon, enabling metrology through the substrate. Optical overlay metrology tools, such as the Archer™-series tools by KLA Corporation (Milpitas, Calif., USA), image an overlay target (such as AIM™ overlay target by KLA) located in the scribe lines of the semiconductor substrate (the lines separating adjacent dies). An image analysis algorithm is applied to the acquired images in order to locate the center of symmetry (CoS) of the target features in the process layer and the CoS of the target features in the patterned photoresist layer. The overlay error is computed as the distance between the centers of symmetry of the target features of the two layers.

U.S. Pat. No. 7,440,105, whose disclosure is incorporated herein by reference, describes overlay marks and methods for determining overlay error. One aspect of this patent relates to a continuously varying offset mark. The continuously varying offset mark is a single mark that includes overlaid periodic structures, which have offsets that vary as a function of position. By way of example, the periodic structures may correspond to gratings with different values of a grating characteristic such as pitch. Another aspect of the patent relates to methods for determining overlay error from the continuously varying offset mark.

The terms "optical rays," "optical radiation," "light," and "beams of radiation," as used in the present description and in the claims, refer generally to any and all of visible, infrared, and ultraviolet radiation.

SUMMARY

Embodiments of the present invention that are described hereinbelow provide improved target features and methods for semiconductor circuit metrology.

There is therefore provided, in accordance with an embodiment of the invention, a product, which includes at least one semiconductor substrate, multiple thin-film layers disposed on the at least one substrate, and an overlay target formed in at least one of the thin-film layers. The overlay target includes a first sub-target having a first center of symmetry and including first target features having a first linewidth, and a second sub-target having a second center of symmetry coincident with the first center of symmetry and including second target features, which have a second linewidth, greater than the first linewidth, and are adjacent to but non-overlapping with the first target features.

In some embodiments, the first sub-target extends over a first area of the at least one semiconductor substrate, and the second sub-target extends over a second area of the at least one semiconductor substrate, wherein the second area is larger than and contains the first area. Additionally, the first sub-target is surrounded by the second sub-target.

In further embodiments, the multiple thin-film layers include a first layer and a second layer overlaid on the first layer, and the first target features include a first set of the first target features formed in the first layer and a second set of the first target features formed in the second layer, and the second target features include a third set of the second target features formed in the first layer and a fourth set of the second target features formed in the second layer.

In some embodiments, the first and second target features include linear gratings. In one embodiment, the first set of the first target features includes first linear gratings in the first layer, the second set of the first target features includes second linear gratings in the second layer, wherein each first linear grating is adjacent to but not overlapping with a second linear grating, the third set of the second target features includes third linear gratings in the first layer, and the fourth set of the second target features includes fourth linear gratings in the second layer, wherein each third linear grating is adjacent to but not overlapping with a fourth linear grating.

In yet further embodiments, the linear gratings in each of the first and second sub-targets include first linear gratings having a first orientation and second linear gratings having a second orientation, which is orthogonal to the first orientation.

In some embodiments, the first and second target features include linear features. In one embodiment, the linear features are arranged to define linear gratings. Alternatively, the linear features are arranged to define square frames, such that the square frames of the first sub-target are contained within the square frames of the second sub-target.

In further embodiments, the first and second target features include respective matrices of square features.

There is also provided, in accordance with an embodiment of the invention, a method for measuring an overlay error. The method includes depositing and patterning multiple thin-film layers on at least one semiconductor substrate to define a matrix of integrated circuit chips and to form an overlay target in at least one of the thin-film layers. The overlay target includes a first sub-target having a first center of symmetry and including first target features having a first linewidth, and a second sub-target having a second center of symmetry coincident with the first center of symmetry and including second target features, which have a second linewidth, greater than the first linewidth, and are adjacent to but non-overlapping with the first target features. The method further includes capturing images of the overlay target, and processing the images to measure an overlay error among the thin-film layers.

In some embodiments, capturing the images includes capturing a first image of the first sub-target using first inspection optics having a first field of view, and capturing a second image of the second sub-target using second inspection optics having a second field of view, which is wider than the first field of view.

In further embodiments, depositing and patterning the multiple thin-film layers includes forming the first sub-target over a first area of the at least one semiconductor substrate that corresponds to the first field of view, and forming the second sub-target over a second area of the at least one semiconductor substrate that is larger than the first area and corresponds to the second field of view.

The present invention will be more fully understood from the following detailed description of the embodiments thereof, taken together with the drawings in which:

DETAILED DESCRIPTION OF EMBODIMENTS

Overview

Figure 1A:
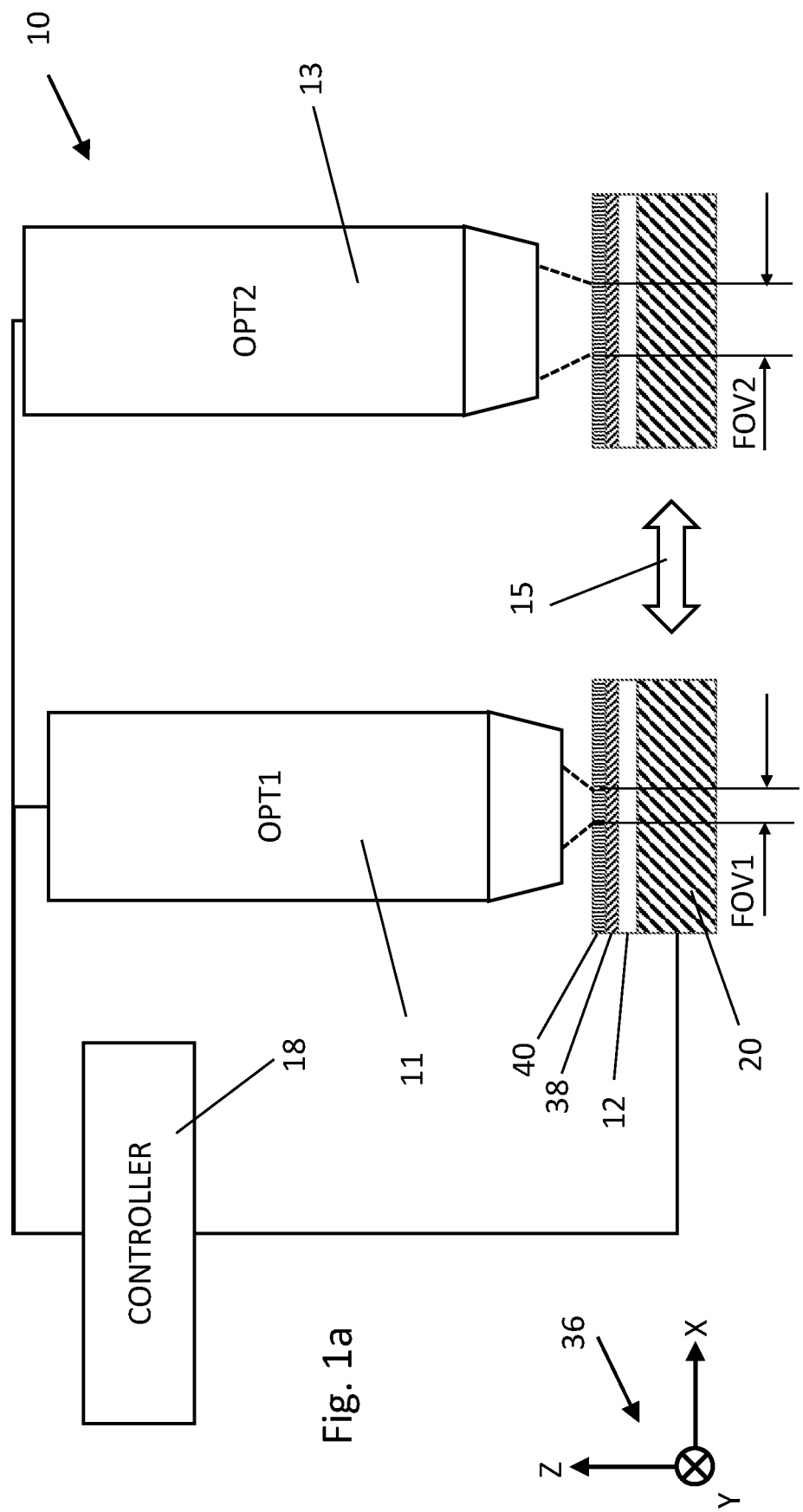
FIG. 1a is a schematic side view of an optical metrology apparatus for measuring overlay error on a semiconductor substrate, in accordance with an embodiment of the invention.

Overlay targets for overlay metrology are commonly used for precise and accurate measurements of the overlay error between successive patterned layers on a semiconductor substrate. These layers may comprise, for example, a process layer and a resist layer (photoresist), or, in after-etch applications, two process layers. Thus, although some example embodiments are described below with reference to a process layer and a resist layer, the principles of these embodiments may be applied, mutatis mutandis, to a first process layer and a second process layer.

In some semiconductor fabrication processes, two overlay metrology tools with fields of view (FOV) of significantly different sizes are used. For example, in a process wherein two silicon substrates are bonded to each other, the mutual alignment of the two substrates during the bonding step may be measured with an overlay tool using illumination comprising infrared (IR) radiation, as IR wavelengths of optical radiation penetrate through a silicon substrate, and a FOV that is either a fixed wide FOV or an adjustable (zoom) FOV. (The spectrum of the illumination may also comprise visible optical radiation, as some of the features of the overlay targets may be located on the surface of the substrate facing the overlay metrology tool.) After the bonding and grinding of the substrates has been completed, a verification of the achieved wafer-to-wafer (or die-to-wafer) alignment may be made using another overlay tool that relies on visible illumination with a narrow FOV. Alternatively, both the through-substrate overlay error measurement and the subsequent verification may be performed with a single overlay metrology tool, provided that the single tool has the required combinations of fields-of-view, as well as a wide illumination spectrum covering both visible and IR wavelengths. The required working distance and focusing accuracy, as well as the illumination options, may be covered either by two separate optical metrology tools or by a single tool with the required capabilities.

In other semiconductor processes, more than two substrates may be bonded to each other. In still other processes, individual semiconductor dies may be bonded to a substrate.

The performance of image-based overlay metrology is strongly dependent on the relationship between the size of the overlay target and the FOV of the overlay metrology tool: When an overlay target is significantly smaller than the FOV, the tool collects an overlay error measurement signal from only a part of its FOV, leading to a reduced signal-to-noise ratio of the measurement and possibly to a loss of resolution of individual target features. Furthermore, the small features of a small overlay target are likely to be poorly matched to the optical resolution of a metrology tool with a wide FOV. However, if the overlay target is significantly larger that the FOV, the measurement results may be distorted or even missing, as some of the data required for the measurement may be outside the captured area due to the large features of the target. For example, if the overlay target is matched to an IR overlay metrology tool with a typical wide FOV of 60 µm×60 µm, the target would overfill a typical narrow FOV of 30 µm×30 µm of a visible-light overlay metrology tool, and the target features may be too coarse for the visible-light tool. If the overlay target is matched to the 30 µm×30 µm FOV of the visible-light metrology tool, only part of the 60 µm×60 µm FOV of the IR-tool would be used, leading to a poor signal-to-noise ratio; moreover the target features may be too small as compared to the optimal resolution of the IR-tool.

A possible solution is to use two separate overlay targets side-by-side, one matched to the wide-FOV tool and the other to the narrow-FOV tool. However, this solution would have the overlay error measured in two spatially separated locations, and a comparison between the results may suffer from the fact that the overlay error depends on the spatial location of the overlay target. Moreover, this kind of a solution would lead to an inefficient use of the valuable "real estate" on the semiconductor substrate.

The embodiments of the present invention that are described herein address this discrepancy between different sizes of fields of view and the size of the overlay target by providing a composite overlay target. The composite overlay target has a small first sub-target and a large second sub-target, wherein the first sub-target is surrounded by and concentric with the second sub-target. The first sub-target is well matched to the narrow-FOV overlay tool both in terms of its overall dimensions and in terms of its feature sizes. Similarly, the dimensions and feature sizes of the second sub-target are matched to the wide-FOV overlay tool. Thus, when the overlay error is measured with the narrow-FOV overlay tool, the tool captures an image of the first sub-target and measures the overlay error with the accuracy provided by this target. When the overlay error is measured with the wide-FOV overlay tool, an image of the entire target is captured. The wide-FOV overlay tool may ignore the part of the first sub-target in the center of the FOV and measure the overlay error from the second sub-target only, which is optimized for the wide FOV.

Making the first and second sub-targets concentric enables accurate matching of the measured overlay errors between the narrow-FOV and wide-FOV overlay metrology tools, for example by directly comparing the overlay errors measured on the two tools and/or by comparing the overlay error models between the two tools. A further improvement in the metrology accuracy is achieved by taking into account the correlation between the measured and modeled overlay error on each tool separately. A quality metric of the overlay error measurement may be extracted from each sub-target separately to validate and to match the measured overlay errors from each tool.

In the disclosed embodiments, multiple thin-film layers are disposed on one or more semiconductor substrates and patterned to define overlay targets formed in the thin-film layers. Each overlay target has a first and a second sub-target, with the centers of symmetry of the two sub-targets coinciding. The two sub-targets are formed adjacent to each other within the area of the overlay target, but they do not overlap. The first sub-target has first target features with a first linewidth, and the second sub-target has target features with a second linewidth.

In the context of the present description and in the claims, the term "linewidth" refers to the narrow transverse dimension of the features, for example the width, rather than the length, of a linear feature. (The "transverse" dimensions are the dimensions of the features in the plane of the thin-film layer in which they are formed.) For symmetrical features, such as square or round features, the "linewidth" refers to either of the transverse dimensions of the features, since the dimensions are equal to one another.

System Description

Figure 1B:
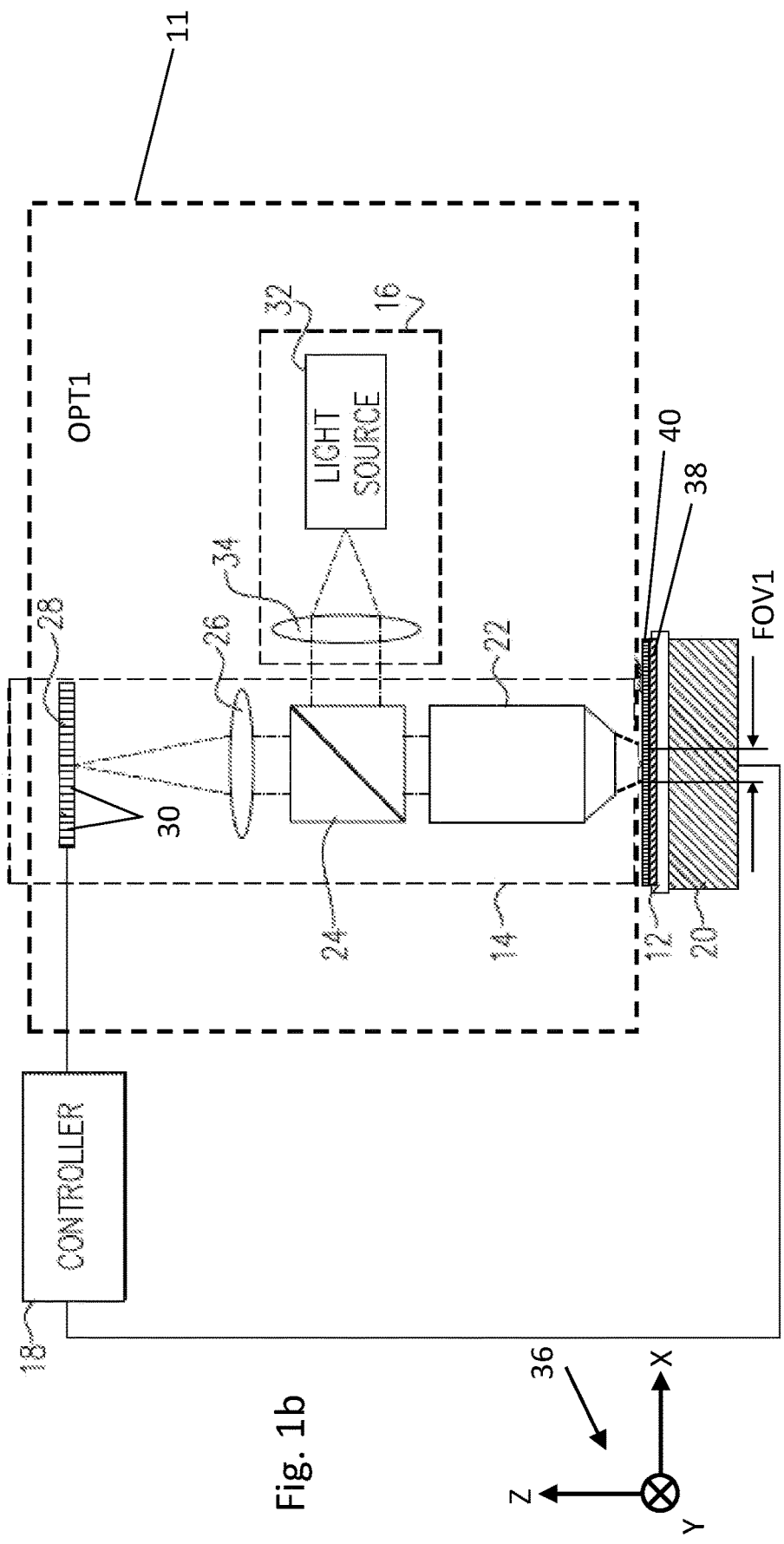
FIG. 1b is a schematic side view of an optical subsystem in the optical metrology apparatus of FIG. 1a, in accordance with an embodiment of the invention.

Reference is now made to FIGS. 1a and 1b, which schematically illustrate an optical metrology apparatus 10 for measuring overlay error on a semiconductor substrate 12, in accordance with an embodiment of the invention. FIG. 1a is a side view of apparatus 10, including optical subsystems 11 and 13, while FIG. 1b is a side view showing details of subsystem 11. Although apparatus 10 is shown in FIGS. 1a and 1b having illumination directed onto substrate 12 from the same side as the collection optics of optical subsystems 11 and 13, in an alternative embodiment the illumination may be directed from below the substrate through a suitably transparent motion assembly 20.

Referring to FIG. 1a, optical metrology apparatus 10 comprises two optical subsystems 11 and 13, referred to respectively as OPT1 and OPT2, for measuring overlay errors on semiconductor substrate 12. OPT1 has a narrow field of view FOV1 with dimensions of 30 µm×30 µm, for example, while OPT2 has a wide field of view FOV2 with dimensions of 60 µm×60 µm, for example. In the present example, OPT1 measures the overlay error using visible-light illumination, whereas OPT2 uses IR illumination. The dimensions of FOV1 and FOV2 as well as the spectral ranges of OPT1 and OPT2 are used here for example only. Other dimensions and spectral ranges may alternatively be used to describe a narrow-FOV and a wide-FOV apparatus for various metrology applications. For example, in an alternative embodiment, optical subsystem 13 (OPT2) may include a light source emitting optical radiation, as well as have metrology optics with a variable FOV (zoom optics). In a further alternative embodiment, optical subsystems 11 and 13 (OPT1 and OPT2) may comprise a single optical system with suitably adjustable FOV, illumination spectrum, and focusing mechanism.

Apparatus 10 further comprises a controller 18 and one or more motion assemblies 20. Controller 18 is coupled to receive images from the sensors of OPT1 and OPT2 (further detailed in FIG. 1b), and to adjust the location and orientation of motion assembly 20. Controller 18 typically comprises a programmable processor, which is programmed in software and/or firmware to carry out the functions that are described herein, along with suitable digital and/or analog interfaces for connection to the other elements of apparatus 10. Alternatively or additionally, controller 18 comprises hard-wired and/or programmable hardware logic circuits, which carry out at least some of the functions of the controller. Although controller 18 is shown in FIGS. 1a and 1b, for the sake of simplicity, as a single, monolithic functional block, in practice the controller may comprise multiple, interconnected control units, with suitable interfaces for receiving and outputting the signals that are illustrated in the figures and are described in the text.

In the pictured example, motion assembly 20 comprises a suitable table, with actuators for moving the table (under the control of controller 18) linearly in x-, y-, and z-directions (with reference to Cartesian coordinates 36), as well as for rotating the table around the z-axis. Cartesian coordinates 36 are shown in this and subsequent figures in order to clarify the orientation of the figures with respect to apparatus 10.

Multiple thin-film layers are deposited and patterned on semiconductor substrate 12 to define a matrix of integrated circuit chips and to form overlay targets in at least one of the thin-film layers. In the pictured example, first and second thin-film layers 38 and 40 have been deposited on semiconductor substrate 12 and patterned in a photolithographic process. For example, first layer 38 may be a process layer, and second layer 40 may be a resist layer, which is deposited over the process layer. Alternatively both of layers 38 and 40 may be process layers. In order to measure the overlay error between the patterns in layer 40 and the patterns in underlying layer 38 on substrate 12, overlay targets having a first and second sub-target suited for the two fields of view, as shown in the figures that follow, have been formed in the photolithographic process in layers 38 and 40.

For measuring the overlay error with apparatus 10, controller 18 moves motion assembly 20 so that semiconductor substrate 12 is in proximity to, for example, OPT1, with an overlay target within FOV1, and measures the overlay error using OPT1. For a different fabrication step, such as bonding two semiconductor substrates to each other, controller 18 may move motion assembly 20 in the xy-plane, as indicated by an arrow 15, so that semiconductor substrate 12 is in proximity to OPT2, with an overlay target within FOV2, and measures the overlay error using OPT2. (For the sake of simplicity, only one substrate 12 is shown). Alternatively, optical subsystems 11 and 13 may comprise two separate motion assemblies 20 for OPT1 and OPT2. For another overlay error measurement with OPT1, substrate 12 may be moved back to OPT1. As will be further detailed hereinbelow, each optical subsystem utilizes a specific part of the overlay target that matches its FOV.

Referring to FIG. 1b, optical subsystem 11 (OPT1) comprise an imaging assembly 14 and an illumination assembly 16. Imaging assembly 14 comprises an objective lens 22, a cube beamsplitter 24, and an imaging lens 26, together forming the metrology optics of optical subsystem 11. Imaging assembly 14 further comprises a sensor 28, comprising for example, a complementary metal-oxide-semiconductor (CMOS) detector with a two-dimensional array of pixels 30. As another example, for sensing under short-wave IR illumination, sensor 28 may comprise an InGaAs based Focal Plane Array (FPA) detector with a two-dimensional array of pixels 30. The field of view of imaging assembly 14 is, with reference to FIG. 1a, FOV1, with dimensions of 30 μm×30 μm. Illumination assembly 16 comprises a light source 32 emitting optical radiation, and a lens 34. Additionally, in some embodiments, light source 32 and/or imaging assembly 14 may have polarizing optical components for controlling the polarization of the emitted and collected optical radiation, respectively.

For measuring the overlay error between the patterns in layer 40 and the patterns in underlying layer 38 on substrate 12 using OPT1, controller 18 commands motion assembly 20 to bring the substrate under objective lens 22, so that the central part of an overlay target is in the field of view FOV1 of OPT1 and so that the combined optics of objective lens 22 and lens 26 image the substrate onto sensor 28, i.e., the substrate and the sensor are located at optical conjugate planes.

To capture an image of the first sub-target, light source 32 projects a beam of optical radiation to lens 34, which further projects the beam to cube beamsplitter 24. Beamsplitter 24 reflects the beam into objective lens 22, which projects the beam onto substrate 12 The radiation impinging on substrate 12 is scattered back to objective lens 22 and passed on to beamsplitter 24, transmitted to lens 26, and focused onto sensor 28. As will be further detailed hereinbelow, controller 18 reads out the images captured by sensor 28 and processes the images in order to identify respective centers of symmetry of the first sub-target in layer 40 and in underlying layer 38 on substrate 12. Controller 18 measures the overlay error between these two patterned layers based on the displacement between the respective centers of symmetry of the first sub-target.

Optical subsystem 13 (OPT2) is similar to optical subsystem 11 (OPT2) described hereinabove. The relevant differences between the optical subsystems are their fields of view and the wavelengths of the optical radiation used for the measurement, achieved by different designs of the imaging and illumination assemblies of the two optical subsystems.

Alternatively, apparatus 10 may be configured for measuring overlay error in a scatterometry mode. For this mode, lens 26 is modified and/or moved so as to image the exit pupil (not shown) of objective lens 22 onto sensor array 28. This scatterometric image is indicative of the angular distribution of the optical radiation that is scattered from the target features, and controller 18 in this case is configured to process the angular distribution in order to measure the overlay error.

Example Overlay Targets

Figure 2A:
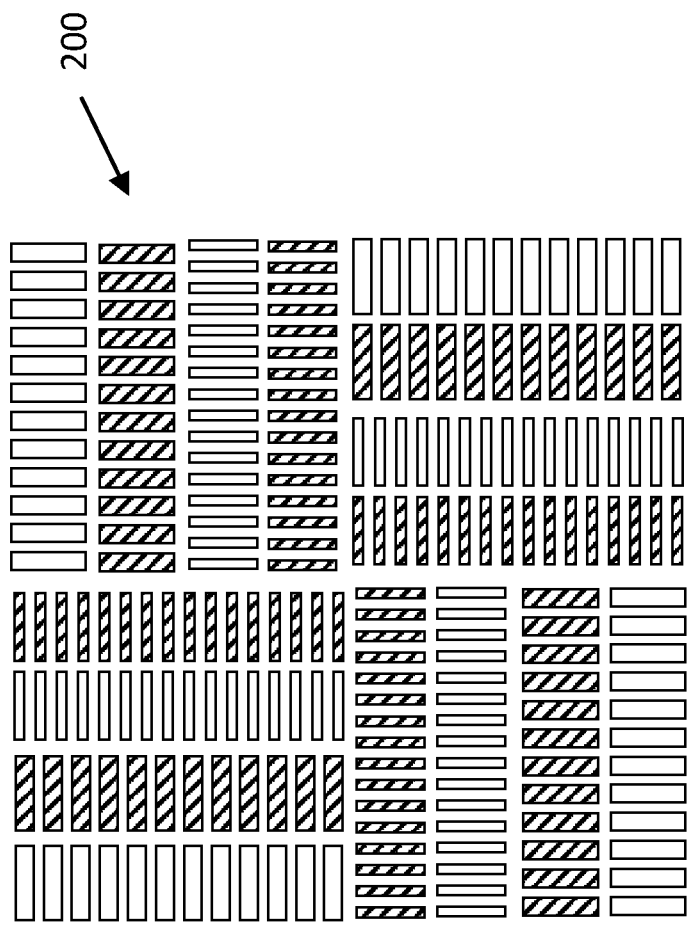
FIG. 2a is a schematic frontal view of an overlay target, in accordance with an embodiment of the invention.
Figure 2A:
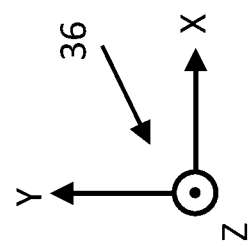
Figure 2B:
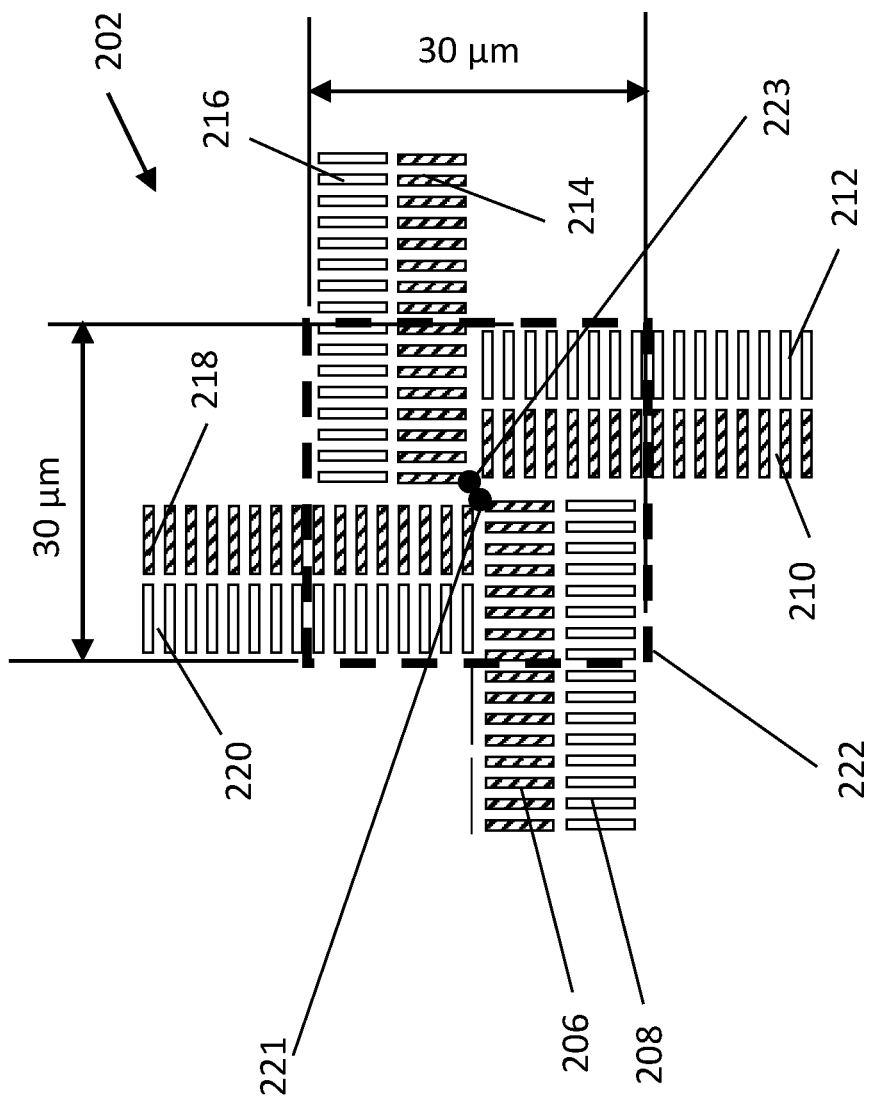
FIGS. 2b and 2c are schematic frontal views of sub-targets used in construction of the overlay target of FIG. 2a, in accordance with an embodiment of the invention.
Figure 2B:
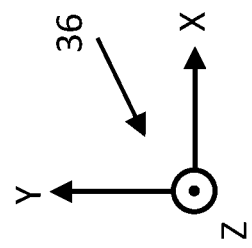
Figure 2C:
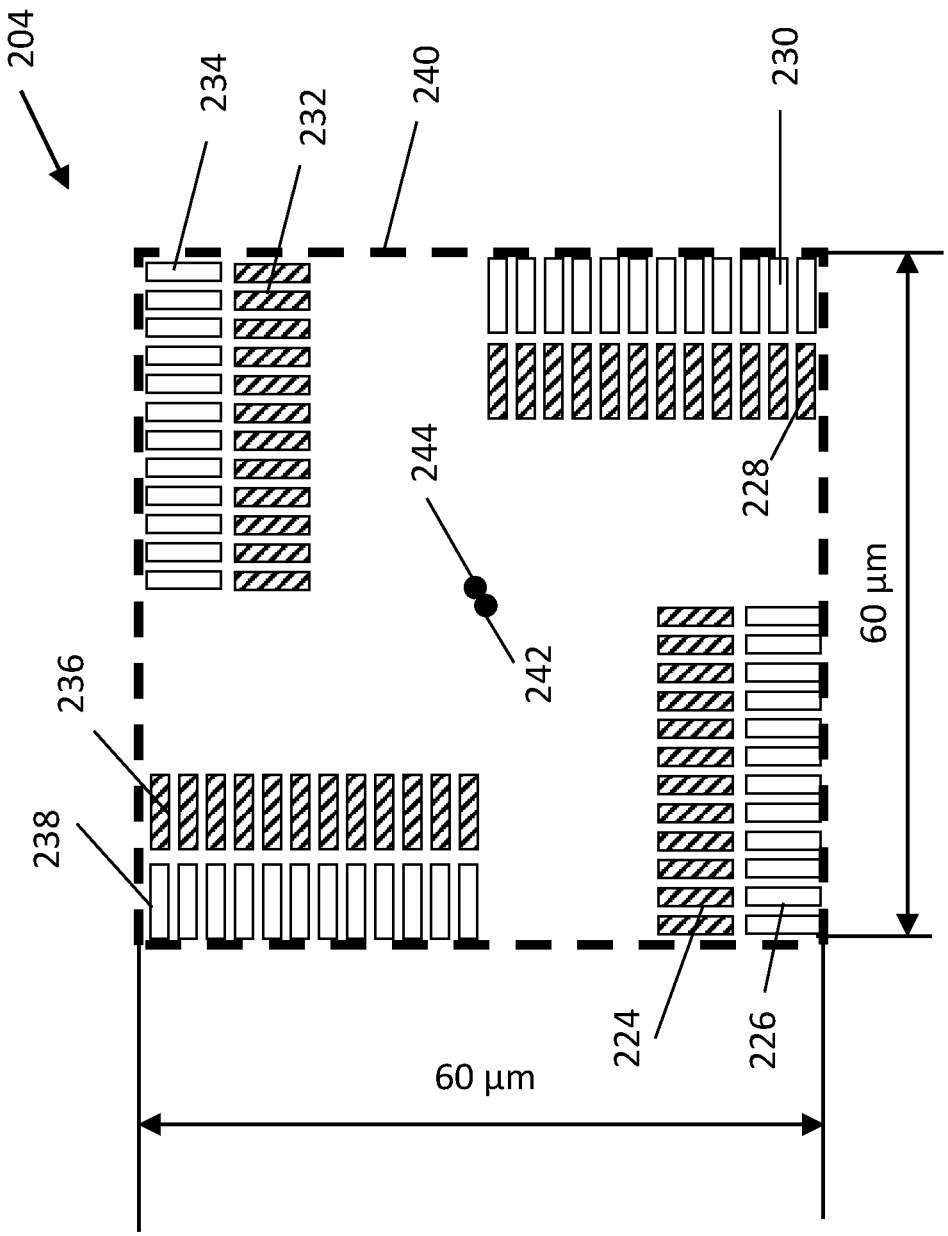
Figure 2C:
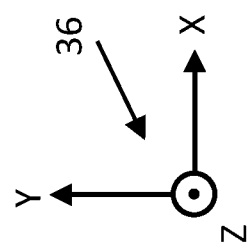

FIGS. 2a-2c show an overlay target 200 and its structure, in accordance with an embodiment of the invention. FIG. 2a is a schematic frontal view of overlay target 200, while FIGS. 2b and 2c are schematic frontal views of a first sub-target 202 and a second sub-target 204, respectively, within target 200. Sub-target 202 extends over a narrow FOV and thus could be imaged by optical subsystem 11 (FIG. 1a), while sub-target 204 extends over a wider FOV and thus could be imaged by optical subsystem 13.

As shown in FIG. 2b, first sub-target 202 comprises eight gratings 206, 208, 210, 212, 214, 216, 218, and 220, which are arranged pair-wise adjacent to each other (but not overlapping). Gratings 206, 210, 214, and 218 are formed in thin-film layer 38, and gratings 208, 212, 216, and 220 are formed in thin-film layer 40. Each grating comprises multiple parallel lines of equal linewidths, with one half of the grating pairs oriented with their lines in the x-direction, and the other half with their grating lines oriented in the y-direction. Thus, in the pictured example, gratings 206, 208, 214 and 216 are oriented orthogonally to gratings 210, 212, 218 and 220.

A dotted-line square 222 with dimensions of 30 μm×30 μm, for example, is superimposed on first sub-target 202 to denote FOV1 of OPT1, showing that the gratings of the first sub-target fill the 30 μm×30 μm FOV (with parts of the gratings "overflowing" beyond FOV1). The linewidths of gratings 206, 208, 210, 212, 214, 216, 218, and 220 of first sub-target 202 are 1 μm, for example, in order to yield a good contrast for images of the first sub-target when captured by OPT1.

With reference to FIG. 1b, for measuring the overlay error between layers 38 and 40 from first sub-target 202 using optical subsystem 11, controller 18 reads out an image (within the FOV1 of OPT1) of the first sub-target captured by sensor 28. Controller 18 further processes the image in order to identify a center of symmetry 221 of the pattern formed by gratings 206, 210, 214, and 218, and a center of symmetry 223 of the pattern formed by gratings 208, 212, 216, and 220. Controller 18 measures the overlay error between the two patterned layers as the displacement between the respective centers of symmetry 221 and 223 of first sub-target 202.

As shown in FIG. 2c, second sub-target 204 comprises eight gratings 224, 226, 228, 230, 232, 234, 236, and 238, which are arranged pair-wise adjacent to each other. Similarly to first sub-target 202, gratings 224, 228, 232, and 236 are formed in thin-film layer 38, and gratings 226, 230, 234, and 238 are formed in thin-film layer 40. Each grating comprises multiple parallel lines of equal linewidths, with one half of the grating pairs oriented with their lines in the x-direction, and the other half with their grating lines oriented in the y-direction, so that gratings 224, 226, 232 and 234 are oriented orthogonally to gratings 228, 230, 236 and 238. However, the linewidths of the gratings of second sub-target 204 are 2 μm, for example, (rather than 1 μm as in first sub-target 202) in order to yield a good contrast for images of the second sub-target when captured by OPT2. A dotted-line square 240 with dimensions of 60 μm×60 μm, for example, is superimposed on second sub-target 204 to denote FOV2 of OPT2, showing that the gratings of the second sub-target fill FOV2.

For measuring the overlay error between layers 38 and 40 from second sub-target 204 using OPT2, controller 18 reads out an image of the second sub-target (including an image of first sub-target 202 in the center of FOV2) from OPT2.

Controller 18 processes this image (blocking out or ignoring the parts of the image from first sub-target 202) in order to identify a center of symmetry 242 of the pattern formed by gratings 224, 228, 232, and 236 and a center of symmetry 244 of the pattern formed by gratings 226, 230, 234, and 238. Controller 18 measures the overlay error between these two patterned layers as the displacement between the respective centers of symmetry 242 and 244 of second sub-target 204.

Figure 3A:
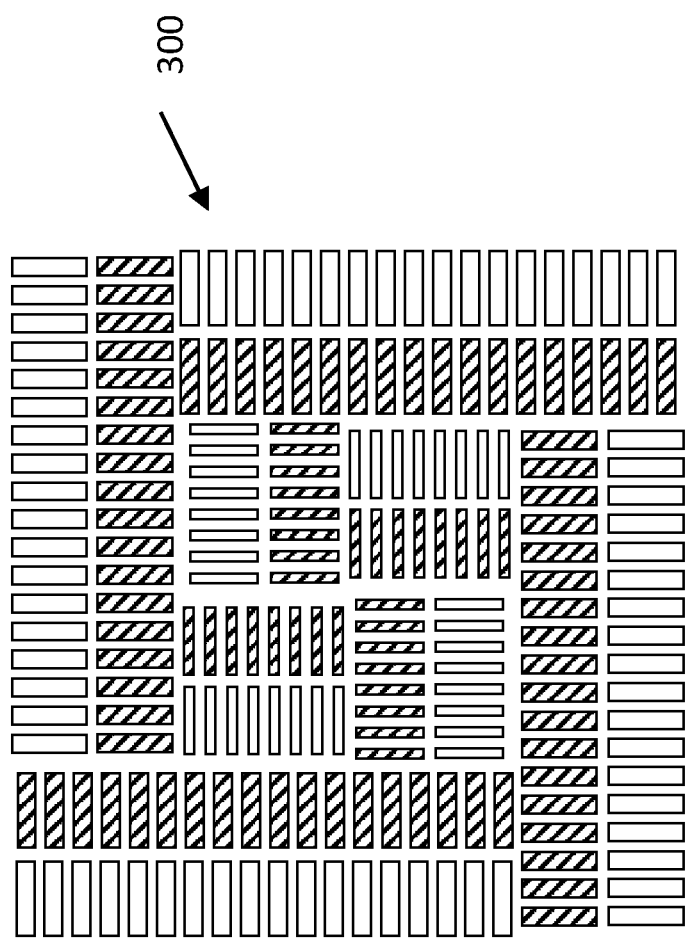
FIG. 3a is a schematic frontal view of an overlay target, in accordance with an alternative embodiment of the invention.
Figure 3A:
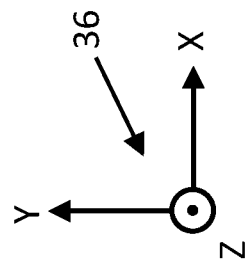
Figure 3B:
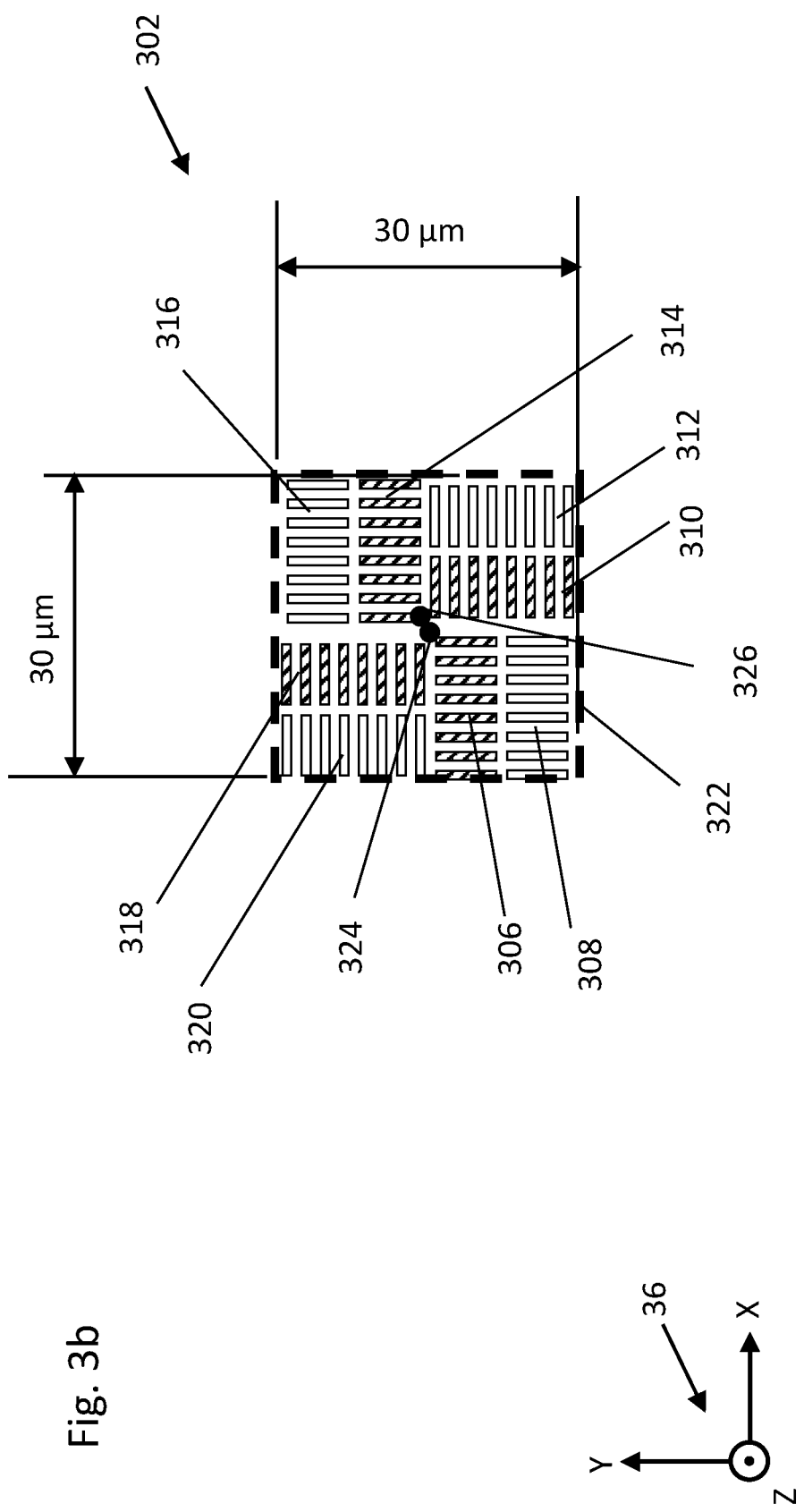
FIGS. 3b and 3c are schematic frontal views of sub-targets used in construction of the overlay target of FIG. 3a, in accordance with an embodiment of the invention.
Figure 3C:
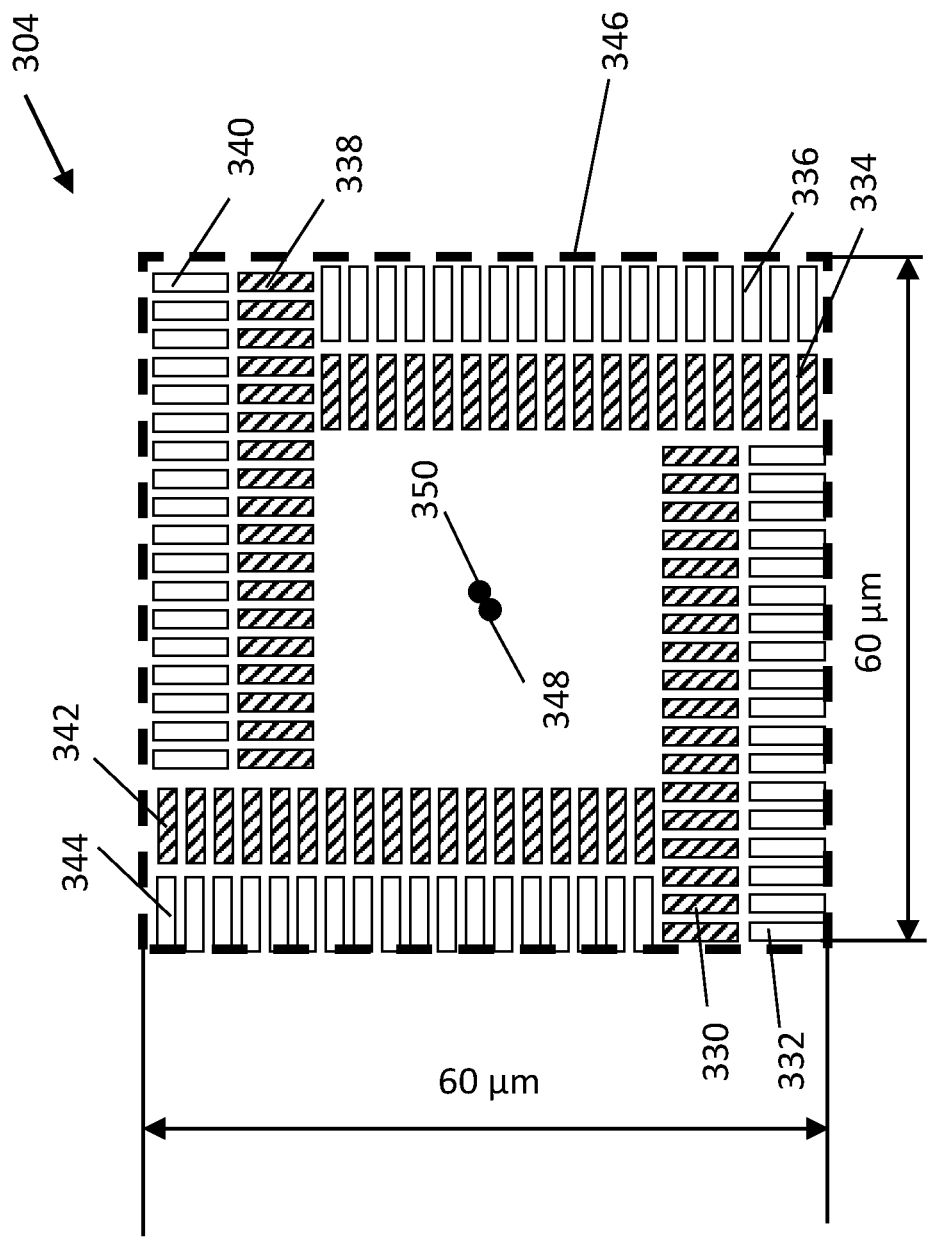
Figure 3C:
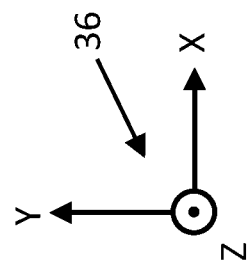

FIGS. 3*a*-3*c* show an overlay target 300 and its structure, in accordance with an alternative embodiment of the invention. FIG. 3*a* is a schematic frontal view of overlay target 300, while FIGS. 3*b* and 3*c* are schematic frontal views of a first sub-target 302 and a second sub-target 304, respectively, within target 300.

As shown in FIG. 3*b*, first sub-target 302 comprises eight gratings 306, 308, 310, 312, 314, 316, 318, and 320, which are arranged pair-wise adjacent to each other. Gratings 306, 310, 314, and 318 are formed in thin-film layer 38, and gratings 308, 312, 316, and 320 are formed in thin-film layer 40. Each grating comprises multiple parallel lines of equal linewidths, with one half of the grating pairs oriented with their lines in the x-direction, and the other half with their grating lines oriented in the y-direction. A dotted-line square 322 with dimensions of 30 µm×30 µm, for example, is superimposed on first sub-target 302 to denote FOV1 of OPT1, showing that the gratings of the first sub-target exactly fill FOV1. The linewidths of gratings 306, 308, 310, 312, 314, 316, 318, and 320 of first sub-target 302 are 1 µm, for example, in order to yield a good contrast for images of the first sub-target when captured by OPT1. First sub-target 302 differs from first sub-target 202 in that in the gratings of target 302 do not extend beyond FOV1.

For measuring overlay error between layers 38 and 40 using OPT1, controller 18 measures, similarly to first sub-target 202, the displacement between respective centers of symmetry 324 and 326 of first sub-target 302, wherein center of symmetry 324 relates to the pattern formed by gratings 306, 310, 314, and 318 and center of symmetry 326 relates to the pattern formed by gratings 308, 312, 316, and 320.

As shown in FIG. 3*c*, second sub-target 304 comprises eight gratings 330, 332, 334, 336, 338, 340, 342, and 344, which are arranged pair-wise adjacent to each other. Similarly to first sub-target 302, gratings 330, 334, 338, and 342 are formed in thin-film layer 38, and gratings 332, 336, 340, and 344 are formed in thin-film layer 40. Similarly to first sub-target 302, each grating comprises multiple parallel lines of equal linewidths, with one half of the grating pairs oriented with their lines in the x-direction, and the other half with their grating lines oriented in the y-direction. However, the linewidths of the gratings of second sub-target 304 are 2 µm, for example, in order to yield a good contrast for images of the second sub-target when captured by OPT2. A dotted-line square 346 with dimensions of 60 µm×60 µm, for example, is superimposed on second sub-target 304 to denote FOV2, showing that the gratings of the second sub-target fill FOV2. Second sub-target 304 differs from second sub-target 204 in that in target 304 its gratings extend over the whole area beyond the central 30 µm×30 µm FOV.

For measuring overlay error between layers 38 and 40 using OPT2, controller 18 measures, similarly to first sub-target 302, the displacement between respective centers of symmetry 348 and 350 of second sub-target 304. Center of symmetry 348 relates to the pattern formed by gratings 330, 334, 338, and 342, while center of symmetry 350 relates to the pattern formed by gratings 332, 336, 340, and 344.

In an alternative embodiment (not shown in the figures), each of the sub-targets in overlay targets 200 and 300 may comprise grating-like structures, which are formed by depositing two overlaid gratings with slightly different pitches in layers 38 and 40. Overlay targets of this sort are described in the above-mentioned U.S. Pat. No. 7,440,105, and the overlay error between layers 38 and 40 may be measured in the manner described in this patent.

Figures 4A, 4B, 4C:
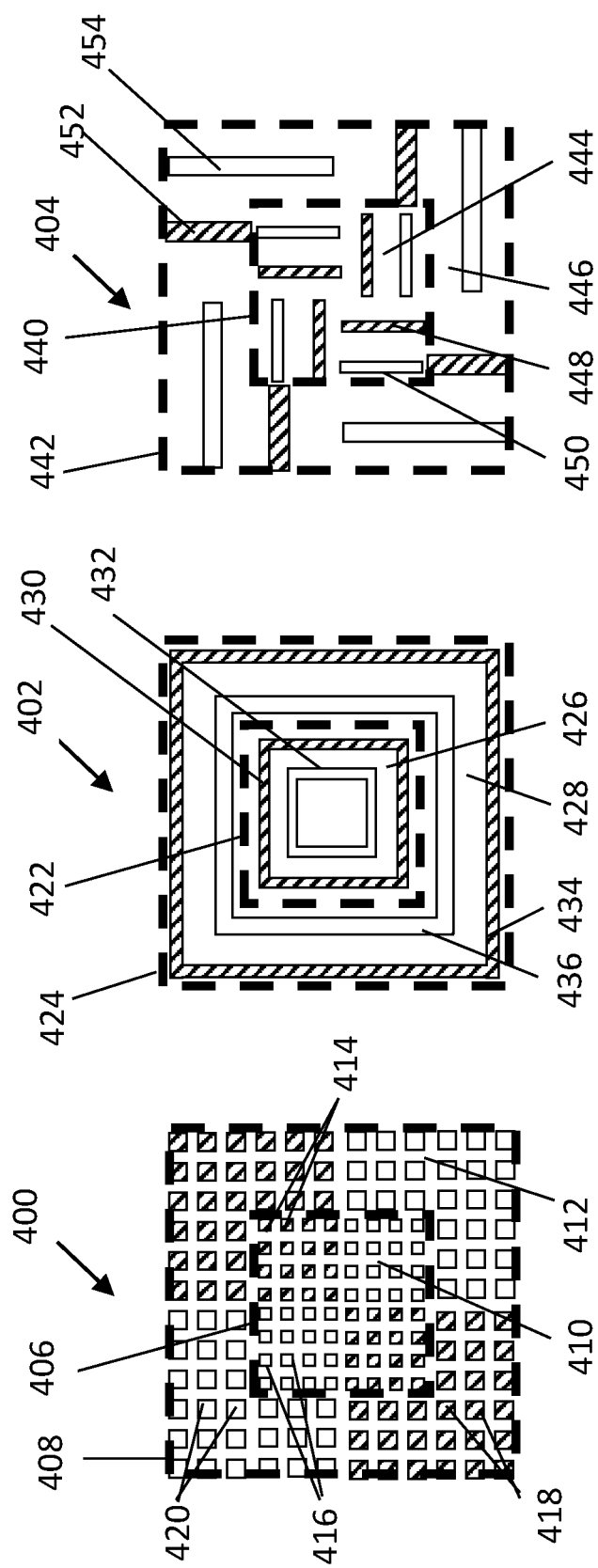
FIGS. 4a-4c are schematic frontal views of overlay targets, in accordance with additional embodiments of the invention.

FIGS. 4*a*-4*c* are schematic frontal views of overlay targets 400, 402, and 404, in accordance with additional embodiments of the invention.

As shown in FIG. 4*a*, overlay target 400 comprises a first sub-target 410 and a second sub-target 412, which are delineated by dotted-line squares 406 and 408 corresponding to the respective fields of view of OPT1 and OPT2, for example. First sub-target 410 is formed by matrices of squares 414 and 416, contained within dotted-line square 406. Second sub-target 412 is formed by matrices of squares 418 and 420 in the area between dotted-line squares 406 and 408. In first sub-target 410, squares 414 are formed in first layer 38, and squares 416 are formed in second layer 40. The dimensions of each of squares 414 and 416 are 1 µm×1 µm, for example (corresponding to a linewidth of 1 µm), in order to be compatible with the optical resolution of OPT1. In second sub-target 412, squares 418 are formed in first layer 38 and squares 420 are formed in second layer 40. The dimensions of each of squares 418 and 420 are 2 µm×2 µm, for example (corresponding to a linewidth of 2 µm), in order to be compatible with the optical resolution of OPT2.

Alternatively, sub-targets 410 and 412 may comprise matrices of rectangles with appropriate respective linewidths.

Apparatus 10 measures the overlay error between layers 38 and 40 through OPT1, similarly to measuring the overlay error from overlay target 200 (FIGS. 2*a*-2*c*), by measuring the displacement between the respective centers of symmetry of the matrix of squares 414 and the matrix of squares 416 of first sub-target 410 (centers of symmetry not shown for the sake of simplicity). Similarly, apparatus 10 measures the overlay error between layers 38 and 40 through OPT2 by measuring the displacement between the respective centers of symmetry of the matrix of squares 418 and the matrix of squares 420 of second sub-target 412.

As shown in FIG. 4*b*, overlay target 402 comprises a first sub-target 426 and a second sub-target 428, which are delineated by dotted-line squares 422 and 424 corresponding to the respective fields of view of OPT1 and OPT2, for example. First sub-target 426 is formed by two square frames 430 and 432 within square 422, while second sub-target 428 is formed by two square frames 434 and 436 in the area between squares 422 and 424. Frames 430 and 434 are formed in layer 38, and frames 432 and 436 are formed in layer 40. The linewidths of frames 430 and 432 of first sub-target 426 are 1 µm, for example, in order to be compatible with the optical resolution of OPT1, whereas the linewidths of frames 434 and 436 of second sub-target 428 are 2 µm, for example, in order to be compatible with the optical resolution of OPT2.

Apparatus 10 measures the overlay error between layers 38 and 40 through OPT1 by measuring the displacement between the respective centers of symmetry of frames 430 and 432 of first sub-target 426 (centers of symmetry not shown for the sake of simplicity). Similarly, apparatus 10 measures the overlay error between layers 38 and 40 through OPT2 by measuring the displacement between the respective centers of symmetry of frames 434 and 436 of second sub-target 428.

A shown in FIG. 4c, overlay target 404 comprises a first sub-target 444 and a second sub-target 446, which are delineated by dotted-line squares 440 and 442 corresponding to the respective fields of view of OPT1 and OPT2, for example. First sub-target 444 is formed by lines 448 and 450, while second sub-target 446 is formed by lines 452 and 454. In first sub-target 444, lines 448 are formed in layer 38 and lines 450 are formed in layer 40, with all the lines formed within square 440 (i.e., within FOV1 of OPT1). Half of both lines 448 and 450 are oriented in the x-direction and half are oriented in the y-direction. The widths of lines 448 and 450 are chosen to be compatible with the optical resolution of OPT1. In second sub-target 446, lines 452 are formed in layer 38 and lines 454 are formed in layer 40, with all the lines formed in the area between squares 440 and 442. Half of both lines 452 and 454 are oriented in the x-direction and half are oriented in the y-direction. The widths of lines 452 and 454 are chosen to be compatible with the optical resolution of OPT2.

Apparatus 10 measures the overlay error between layers 38 and 40 through OPT1 by measuring the displacement between the respective centers of symmetry of the pattern formed by lines 448 and the pattern formed by lines 450 of first sub-target 444 (centers of symmetry not shown for the sake of simplicity). Similarly, apparatus 10 measures the overlay error between layers 38 and 40 through OPT2 by measuring the displacement between the respective centers of symmetry of the pattern formed by lines 452 and the pattern formed by lines 454 of second sub-target 446.

The sub-target dimensions of 30 μm×30 μm and 60 μm×60 μm, as well as linewidths of 1 μm and 2 μm, were chosen in the embodiments described above to match the characteristic fields of view and resolution levels of the example optical subsystems OPT1 and OPT2. Alternatively, larger or smaller sub-target dimensions and larger or smaller feature linewidths may be used, depending on the characteristics of the inspection optics that are to be used in measuring overlay errors.

Furthermore, although the preceding figures showed certain types of target features and layouts by way of example, the principles of the present invention may similarly be implemented in overlay targets and sub-targets comprising other sorts of features and layouts. All such alternative implementations are considered to be within the scope of the present invention.

Additional Applications of Multi-Resolution Overlay Targets

Having target features with different design parameters (for example different spatial frequencies) in the same layer (for example thin-film layer 40) enables measuring an apparent displacement between these different target features using overlay error metrology. For example, with reference to FIGS. 2b and 2c, the patterns of first and second sub-targets 202 and 204 in layer 40 are formed in the same photolithographic step, and consequently no displacement would be expected between the locations of their respective centers of symmetry 223 and 244, as measured through OPT1 and OPT2. However, errors due to optical aberrations or obstructions in each of optical subsystems OPT1 and OPT2 may yield a non-zero displacement between the measured locations of the centers of symmetry. Characterizing these errors, in turn, can be utilized for correcting errors in the overlay error measurements. The errors may also be fed forward into the fabrication process for reducing the measurement errors in the subsequent fabrication steps, specifically by an alignment system used in aligning and bonding two semiconductor substrates.

Additionally or alternatively, for matching between the two sets of overlay errors measured by each of the optical subsystems OPT1 and OPT2, controller 18 can compute for each of the sets a modeled overlay error. Comparisons between both the measured and modeled overlay errors within each optical subsystem and between the subsystems may be utilized for improved accuracy of the metrology results. Further additionally or alternatively, a quality metric of the overlay error measurement may be extracted from each sub-target separately to validate and to match the measured overlay errors from each tool.

Additionally or alternatively, similar measurements of displacements between target features in the same layer may indicate pattern placement errors due to optical aberrations in the photolithography system (scanner), as these aberrations may displace printed features of different spatial frequencies with respect to one another. The knowledge of these errors may enable a reduction of their impact in the electronic devices formed in the photolithography process.

An analysis of angular spectral signatures from either two different target features or two different measurement setups of a given feature may enable a reduction in errors of overlay error measurements that are due to target feature asymmetries.

The measurement results of overlay errors from multiple overlay targets, such as those shown in FIGS. 2a, 3a, and 4a-4c, may be combined for reducing the total measurement uncertainty (TMU) of the measurements.

The multi-resolution overlay targets described hereinabove may be adapted to extend over three or more thin-film layers, thus enabling the measurement of the overlay error between any pair of these layers.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A product, comprising:
   at least one semiconductor substrate;
   multiple thin-film layers disposed on the at least one substrate; and
   an overlay target formed in at least one of the thin-film layers and comprising:
   a first sub-target having a first center of symmetry and comprising first target features having a first linewidth; and
   a second sub-target having a second center of symmetry coincident with the first center of symmetry and comprising second target features, which have a second linewidth greater than the first linewidth, and are adjacent to but non-overlapping with the first target features, wherein the second target features and the first target features have a same shape, and wherein the second sub-target has at least twice an area of the first sub-target.

2. The product according to claim 1, wherein the first sub-target extends over a first area of the at least one semiconductor substrate, and the second sub-target extends over a second area of the at least one semiconductor substrate, wherein the second area is larger than and contains the first area.

3. The product according to claim 2, wherein the first sub-target is surrounded by the second sub-target.

4. The product according to claim 1, wherein the multiple thin-film layers comprise a first layer and a second layer overlaid on the first layer, and
wherein the first target features comprise a first set of the first target features formed in the first layer and a second set of the first target features formed in the second layer, and the second target features comprise a third set of the second target features formed in the first layer and a fourth set of the second target features formed in the second layer.

5. The product according to claim 4, wherein the first and second target features comprise linear gratings.

6. The product according to claim 5, wherein the first set of the first target features comprises first linear gratings in the first layer, and the second set of the first target features comprises second linear gratings in the second layer, wherein each first linear grating is adjacent to but not overlapping with a second linear grating, and
wherein the third set of the second target features comprises third linear gratings in the first layer, and the fourth set of the second target features comprise fourth linear gratings in the second layer, wherein each third linear grating is adjacent to but not overlapping with a fourth linear grating.

7. The product according to claim 5, wherein the linear gratings in each of the first and second sub-targets comprise first linear gratings having a first orientation and second linear gratings having a second orientation, which is orthogonal to the first orientation.

8. The product according to claim 1, wherein the first and second target features comprise linear features.

9. The product according to claim 8, wherein the linear features are arranged to define linear gratings.

10. The product according to claim 8, wherein the linear features are arranged to define square frames, such that the square frames of the first sub-target are contained within the square frames of the second sub-target.

11. The product according to claim 1, wherein the first and second target features comprise respective matrices of square features.

12. A method for measuring an overlay error, comprising:
depositing and patterning multiple thin-film layers on at least one semiconductor substrate to define a matrix of integrated circuit chips and to form an overlay target in at least one of the thin-film layers, the overlay target comprising:
a first sub-target having a first center of symmetry and comprising first target features having a first linewidth; and
a second sub-target having a second center of symmetry coincident with the first center of symmetry and comprising second target features, which have a second linewidth, greater than the first linewidth, and are adjacent to but non-overlapping with the first target features;
capturing images of the overlay target, wherein the capturing includes:
capturing a first image of the first sub-target using first inspection optics having a first field of view and a first wavelength; and
capturing a second image of the second sub-target using second inspection optics having a second field of view, which is wider than the first field of view, and that includes a second wavelength, which is larger than the first wavelength; and
processing the images to measure an overlay error among the thin-film layers.

13. The method according to claim 12, wherein depositing and patterning the multiple thin-film layers comprises forming the first sub-target over a first area of the at least one semiconductor substrate that corresponds to the first field of view, and forming the second sub-target over a second area of the at least one semiconductor substrate that is larger than the first area and corresponds to the second field of view.

14. The method according to claim 13, wherein the first sub-target is surrounded by the second sub-target.

15. The method according to claim 12, wherein depositing the multiple thin-film layers comprises depositing a first layer and a second layer overlaid on the first layer, and
wherein patterning the multiple thin-film layers comprises forming a first set of the first target features in the first layer and a second set of the first target features in the second layer, and forming a third set of the second target features in the first layer and a fourth set of the second target features in the second layer.

16. The method according to claim 15, wherein the first and second target features comprise linear gratings.

17. The method according to claim 16, wherein forming the first set of the first target features comprises forming first linear gratings in the first layer, and forming the second set of the first target features comprises forming second linear gratings in the second layer, wherein each first linear grating is adjacent to but not overlapping with a second linear grating, and
wherein forming the third set of the second target features comprises forming third linear gratings in the first layer, and forming the fourth set of the second target features comprises forming fourth linear gratings in the second layer, wherein each third linear grating is adjacent to but not overlapping with a fourth linear grating.

18. The method according to claim 16, wherein the linear gratings in each of the first and second sub-targets comprise first linear gratings having a first orientation and second linear gratings having a second orientation, which is orthogonal to the first orientation.

19. The method according to claim 12, wherein the first and second target features comprise linear features.

20. The method according to claim 19, wherein patterning the multiple thin-film layers comprises arranging the linear features to define linear gratings.

21. The method according to claim 19, wherein patterning the multiple thin-film layers comprises arranging the linear features to define square frames, such that the square frames of the first sub-target are contained within the square frames of the second sub-target.

22. The method according to claim 12, wherein the first and second target features comprise respective matrices of square features.

* * * * *